United States Patent
Ye

(10) Patent No.: US 7,227,477 B2
(45) Date of Patent: Jun. 5, 2007

(54) METHOD AND APPARATUS FOR PERFORMING SAMPLE RATE CONVERSION

(75) Inventor: Zhuan Ye, Vernon Hills, IL (US)

(73) Assignee: General Instrument Corporation, Horsham, PA (US)

( * ) Notice: Subject to any disclaimer, the term of this patent is extended or adjusted under 35 U.S.C. 154(b) by 0 days.

(21) Appl. No.: 11/289,923

(22) Filed: Nov. 30, 2005

(65) Prior Publication Data
US 2006/0290543 A1 Dec. 28, 2006

Related U.S. Application Data

(60) Provisional application No. 60/694,425, filed on Jun. 27, 2005.

(51) Int. Cl.
*H03M 7/00* (2006.01)
(52) U.S. Cl. .......................................... 341/61; 341/144
(58) Field of Classification Search ................... 341/61, 341/50, 144, 143; 708/300
See application file for complete search history.

(56) References Cited

U.S. PATENT DOCUMENTS 5,365,182 A * 11/1994 King ........................... 327/115
5,907,295 A * 5/1999 Lin ............................... 341/61
6,057,789 A * 5/2000 Lin ............................... 341/61

OTHER PUBLICATIONS

"A Frequency-Agile Single Chip QAM Modulator With Beamforming Diversity"; Kyung-Ho Cho and Henry Samueli; IEEE Journal of Solid-State Circuits, USA; vol. 36, No. 3, Mar. 2001.

* cited by examiner

Primary Examiner—Peguy JeanPierre
(74) Attorney, Agent, or Firm—Larry T. Cullen

(57) ABSTRACT

A digital modulator having a sample rate converter that does not require that the final output sampling rate, $F_{OUT}$, of the sample rate converter be at least twice as great as the input sampling rate, $F_{IN}$, of the sample rate converter. The upsampling interpolation filter stages of the sample rate converter of the invention do not require any reference clocks to be provided by the NCO of the sample rate converter. Therefore, the upsampling interpolation filter stages are decoupled from the final output sampling rate, $F_{OUT}$. The interpolation algorithms may be implemented in software, hardware, or a combination of software and hardware. In addition, the polynomial-based interpolator of the Farrow Structure of the invention is capable of using an even or odd number of basepoints.

26 Claims, 8 Drawing Sheets

| CASE # | NCO[K-1] >=0.5 | CO[K] | NCO[K] >=0.5 | INCREASE $n_k$ |
|---|---|---|---|---|
| 1 | Y | 1 | N | 0 |
| 2 | Y | 1 | Y | 1 |
| 3 | Y | 0 | Y | 0 |
| 4 | N | 1 | N | 1 |
| 5 | N | 0 | Y | 1 |
| 6 | N | 0 | N | 0 |

TABLE 1

METHOD AND APPARATUS FOR PERFORMING SAMPLE RATE CONVERSION

CROSS-REFERENCE TO RELATED APPLICATIONS

This application claims priority to the filing date of a U.S. provisional patent application having Ser. No. 60/694,425, entitled "SAMPLE RATE CONVERTER FOR DIGITAL UNIVERSAL MODULATOR", filed on Jun. 27, 2005, which is incorporated herein by reference in its entirety.

TECHNICAL FIELD OF THE INVENTION

The invention relates to digital communications and, more particularly, to performing sample rate conversion in a digital communications system.

BACKGROUND OF THE INVENTION

Digital modulators are widely used in digital communication systems, such as, for example, digital wireless systems and digital cable systems. Various standards govern the various types of communications systems. Each set of standards specifies a particular symbol rate to be used to transmit and receive information. FIG. 1 illustrates a block diagram of a known digital modulator 1. The digital modulator 1 has a multi-stage upsampling filter 2 and an output sampling rate stage 3. The multi-stage upsampling filter 2 comprises a square root raised cosine (SRRC) filter 4 that performs pulse shaping, and M stages of interpolation filters 5 and 6 for upsampling the signal output from the SRRC filter 4 to convert the signal to a rate that is relatively close to the final output rate produced by the output sampling rate stage 3. For ease of illustration, only two interpolation stages 5 and 6 are shown in FIG. 1, although more than two interpolation stages are typically used.

The output sampling rate stage 3 includes a sample rate converter 7 for further interpolation from a sampling rate that is an integer multiple of the symbol rate, $F_{IN}=N_M*F_{SYM}$, to the arbitrary output sampling rate not related to the symbol rate, $F_{OUT}$. This final stage 7 of interpolation requires its interpolation ratio to be continuously variable. If a digital intermediate frequency (IF) architecture is used, the base-band signal will be translated to the desired IF frequency using a quadrature direct digital frequency synthesizer (QDDFS) 8. The digital-to-analog converter (DAC) 9 receives the signal output from the QDDFS 8 at a sample rate of $F_{OUT}$ and produces an analog output signal.

The M interpolation filter stages 5 and 6 that perform interpolation from the input symbol rate, $F_{SYM}$, to the input sampling rate, $F_{IN}=N_M*F_{SYM}$, of the output sampling rate stage 3 are related to the symbol rate $F_{SYM}$ by a factor of $N_1$ and $N_2$, respectively, where M=2. The factor $N_M$ is equal to the cumulative product of the interpolation ratio of each interpolation filter stage. The sample rate converter 7 further interpolates the signal from $F_{IN}=N_M*F_{SYM}$ to a new sampling rate $F_{OUT}$.

FIG. 2 illustrates a block diagram of the sample rate converter 7 shown in FIG. 1. The sample rate converter 7 comprises a numerically controlled oscillator (NCO) 11, which supplies the interpolation interval $\mu_k$ to a Farrow Structure 15, and generates the reference clocks, $CLK_{REF1}$ and $CLK_{REF2}$, to the interpolation filter stages 5 and 6. The reference clocks of the interpolation filter stages have various frequencies equal to $N_i$ times the symbol clock, where $N_i$ is the ratio between the output sampling rate of the $i^{th}$ interpolation stage and the original symbol rate. The Farrow Structure 15 is a well-known computational block that performs polynomial-based interpolation.

The NCO 11 is implemented using a digital accumulator 12. One input of the accumulator 12 is the frequency control word (FCW), which is equal to $F_{IN}/F_{OUT}$. On every clock cycle, the accumulator 12 adds the FCW to the accumulated results from the previous clock cycle, which are stored in register 13. When FCW is less than or equal to 0.5, the most significant bit (MSB) of the accumulated results toggles at an effective rate that is equal to the input clock rate, $F_{IN}$, which is the output rate of the multi-stage upsampling filter 2. This clock is further divided by a divider 14 to generate the clocks $CLK_{REF1}$ and $CLK_{REF2}$ of the interpolation filter stages 5 and 6 of the multi-stage upsampling filter 2 shown in FIG. 1. Thus, the clocks of the interpolation filter stages 5 and 6 differ only by integer times.

A number L of the MSBs of the accumulated results output from register 13 are used to calculate the polynomial coefficients used by the Farrow Structure 15. The Farrow Structure 15 performs polynomial-based interpolation by multiplying its input, which has a sample rate of $F_{IN}$, by the polynomial coefficients to produce the final output having a sample rate of $F_{OUT}$. The value of $\mu_k$, which corresponds to the interpolation interval for interpolating samples in between the original samples, is also derived from the accumulated results output from register 13.

In order to use the configuration of the NCO 11 shown in FIG. 2, $F_{OUT}$ needs to be at least twice as great as $F_{IN}$. In addition, because each interpolation filter stage requires its own reference clock, the configuration shown in FIG. 2 cannot be easily implemented in software, if it can be implemented in software at all. Also, because the reference clocks of the interpolation filter stages are derived from the output sampling rate stage, the upsampling performed by the interpolation filter stages is necessarily coupled to the final output sample rate, $F_{OUT}$.

A need exists for a method and apparatus for performing sample rate conversion that can be efficiently implemented in hardware and/or software, that do not require that the output sampling rate, $F_{OUT}$, be at least twice as great as the input sampling rate, $F_{IN}$, and that decouples the upsampling performed by the interpolation filter stages from the final output sample rate, $F_{OUT}$.

SUMMARY OF THE INVENTION

The invention provides a method and apparatus for performing sample rate conversion. The apparatus comprises an upsampling filter stage and an output sampling rate stage. The upsampling filter stage has an interpolation filter stage for performing upsampling interpolation on a signal that is input to the upsampling filter stage. The interpolation filter stage interpolates the input signal with a cumulative interpolation ratio product of $N_M$ to produce an upsampled signal. The input signal to the upsampling filter stage has a sample rate of $F_{SYM}$. The upsampled signal produced by the interpolation filter stage has a sample rate of $F_{IN}$, wherein $F_{IN}=N_M \times F_{SYM}$. The output sampling rate stage has a sample rate converter that converts the upsampled signal into an output signal having a sample rate of $F_{OUT}$.

The ratio of $F_{OUT}$ to $F_{IN}$ may be less than, equal to, or greater than two. In accordance with one embodiment, the ratio of $F_{OUT}$ to $F_{IN}$ is less than two.

The interpolation stage may be implemented in hardware, software, or a combination of hardware and software. In accordance with one embodiment, the interpolation filter stage is implemented in software.

In accordance with one embodiment, the sample rate converter comprises a numerically controlled oscillator (NCO) having an accumulator, a register and a divider. The accumulator receives a frequency control word (FCW) and adds the FCW with a previous accumulated value to produce a current accumulated value. The current accumulated value includes a current carry out value. The register temporarily stores the previous accumulated value, which includes a previous carry out value. The divider receives the previous carry out value from the register and divides the previous carry out value by $N_M$ to produce a Request For Data control signal having a frequency equal to $F_{SYM}$. The control signal is output to the upsampling filter stage, which uses the control signal to control timing of inputting the input signal to the upsamling filter stage.

The method comprises receiving a Request For Data signal in an upsampling filter stage, receiving an input signal in the upsampling filter stage, interpolating the input signal with a cumulative interpolation ratio product of $N_M$ when the Request For Data signal is asserted to produce an upsampled signal having a sample rate of $F_{SYM}$, and writing the upsampled signal to an output sampling rate stage having a sample rate converter. The upsampled signal produced by the interpolation filter stage has a sample rate of $F_{IN}$, wherein $F_{IN}=N_M \times F_{SYM}$.

The invention also provides a computer program embodied in a computer-readable medium for performing interpolation in software in the upsampling filter stage. The program comprises instructions for receiving a Request For Data signal in an upsampling filter stage, instructions for receiving an input signal in the upsampling filter stage, and instructions for causing the input signal to be interpolated when the received Request For Data signal is asserted, and instructions for writing the upsampled signal to an output sampling rate stage having a sample rate converter. The input signal is interpolated with a cumulative interpolation ratio product of $N_M$ to produce an upsampled signal. The input signal to the upsampling filter stage has a sample rate of $F_{SYM}$. The upsampled signal produced by the interpolation filter stage has a sample rate of $F_{IN}$, wherein $F_{IN}=N_M \times F_{SYM}$.

These and other features and advantages of the invention will become apparent from the following description, drawings and claims.

BRIEF DESCRIPTION OF THE DRAWINGS

FIG. 6 illustrates a table that is implemented in the buffer read control logic shown in FIG. 5 when an odd number of basepoints are used.

DETAILED DESCRIPTION OF THE PREFERRED EMBODIMENT

The invention provides a digital modulator having a sample rate converter that does not require that the final output sampling rate, $F_{OUT}$, of the sample rate converter be at least twice as great as the input sampling rate, $F_{IN}$, of the sample rate converter. In addition, the upsampling interpolation filter stages of the sample rate converter of the invention do not require any reference clocks to be provided by the NCO of the sample rate converter. Therefore, the upsampling interpolation filter stages are decoupled from the final output sampling rate, $F_{OUT}$. This feature of the invention makes it feasible to implement the interpolation algorithms in software. Therefore, the interpolation algorithms may be implemented in software, hardware, or a combination of software and hardware. In addition, the polynomial-based interpolator of the Farrow Structure of the invention is capable of using an odd number of basepoints, although it is not required to use an odd number of basepoints. The polynomial-based interpolator of the Farrow Structure of the invention may use an odd or even number of basepoints, as described below in detail with reference to FIGS. 5–7.

Figure 1:
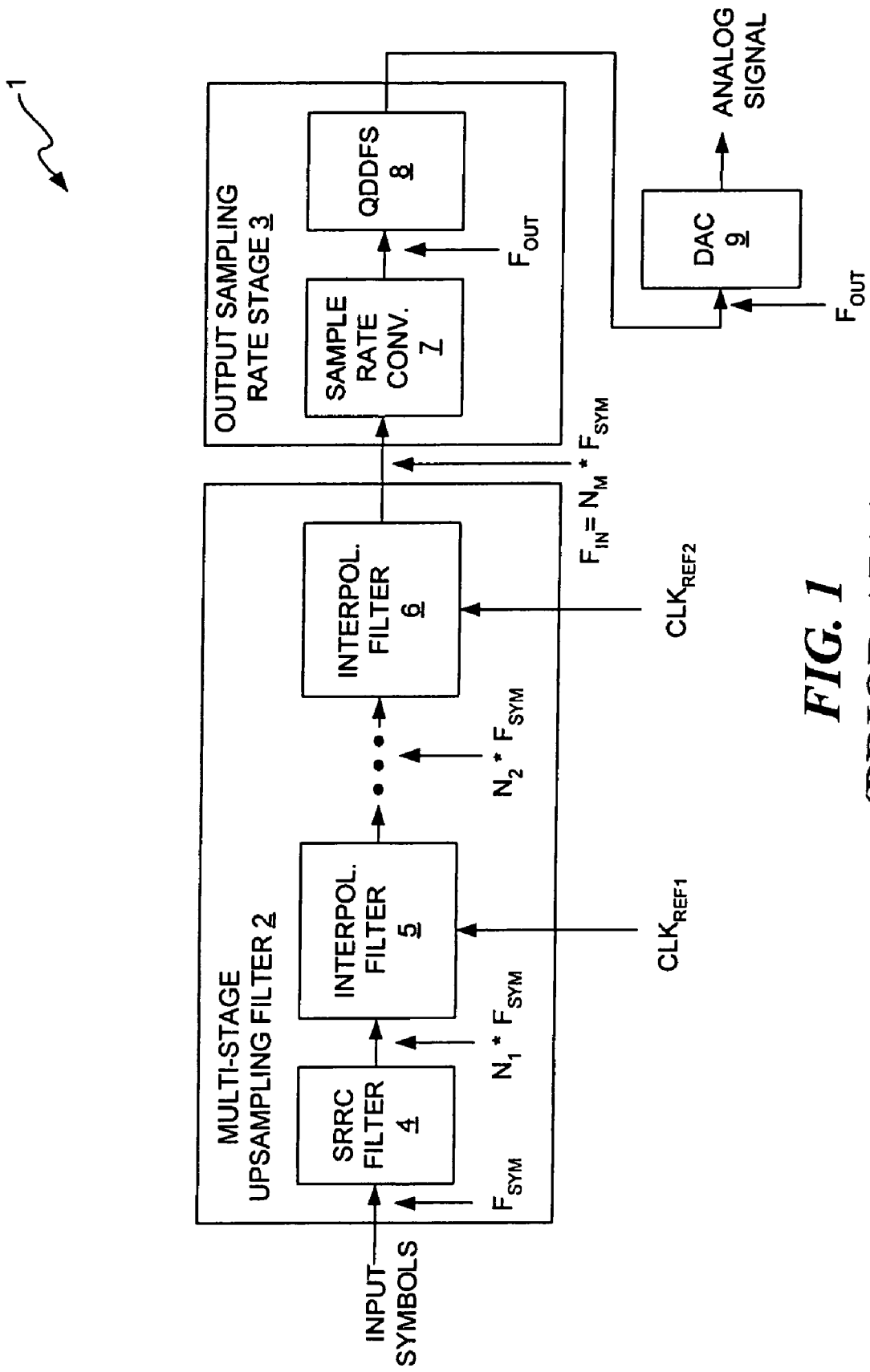
FIG. 1 illustrates a block diagram of a known digital modulator.
Figure 2:
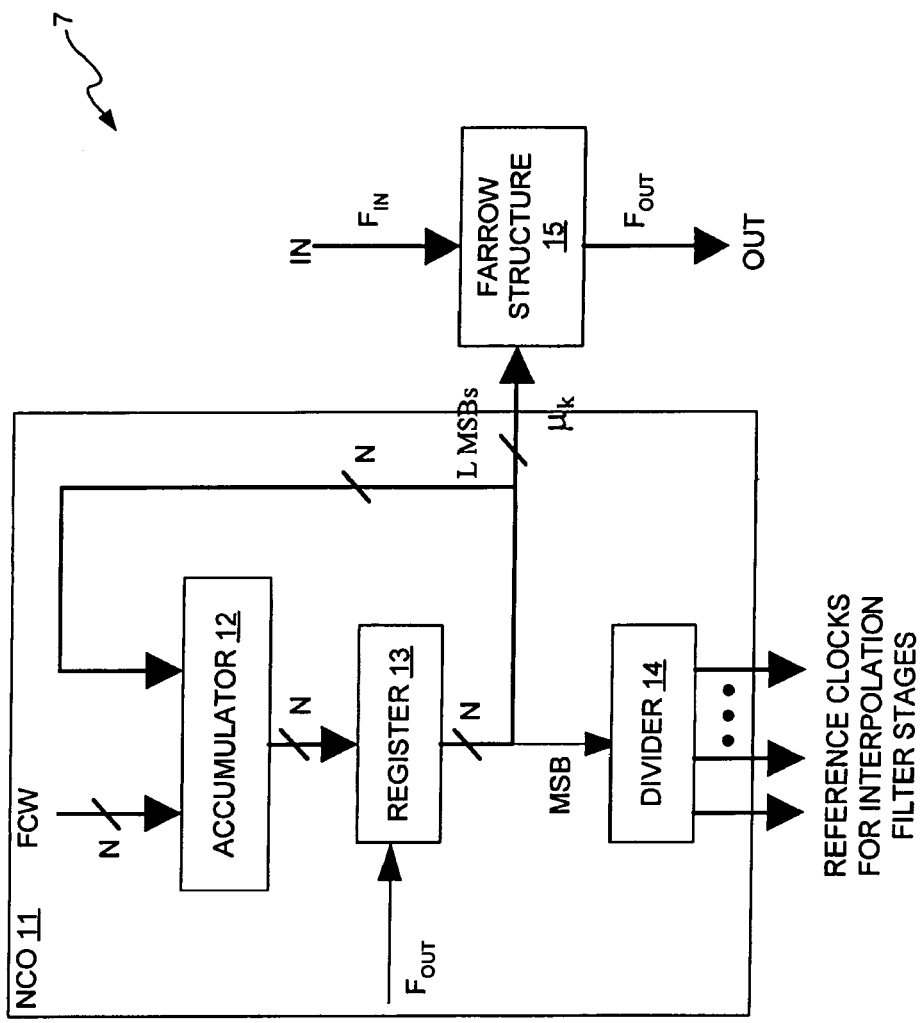
FIG. 2 illustrates a block diagram of the sample rate converter of the digital modulator shown in FIG. 1.
Figure 3:
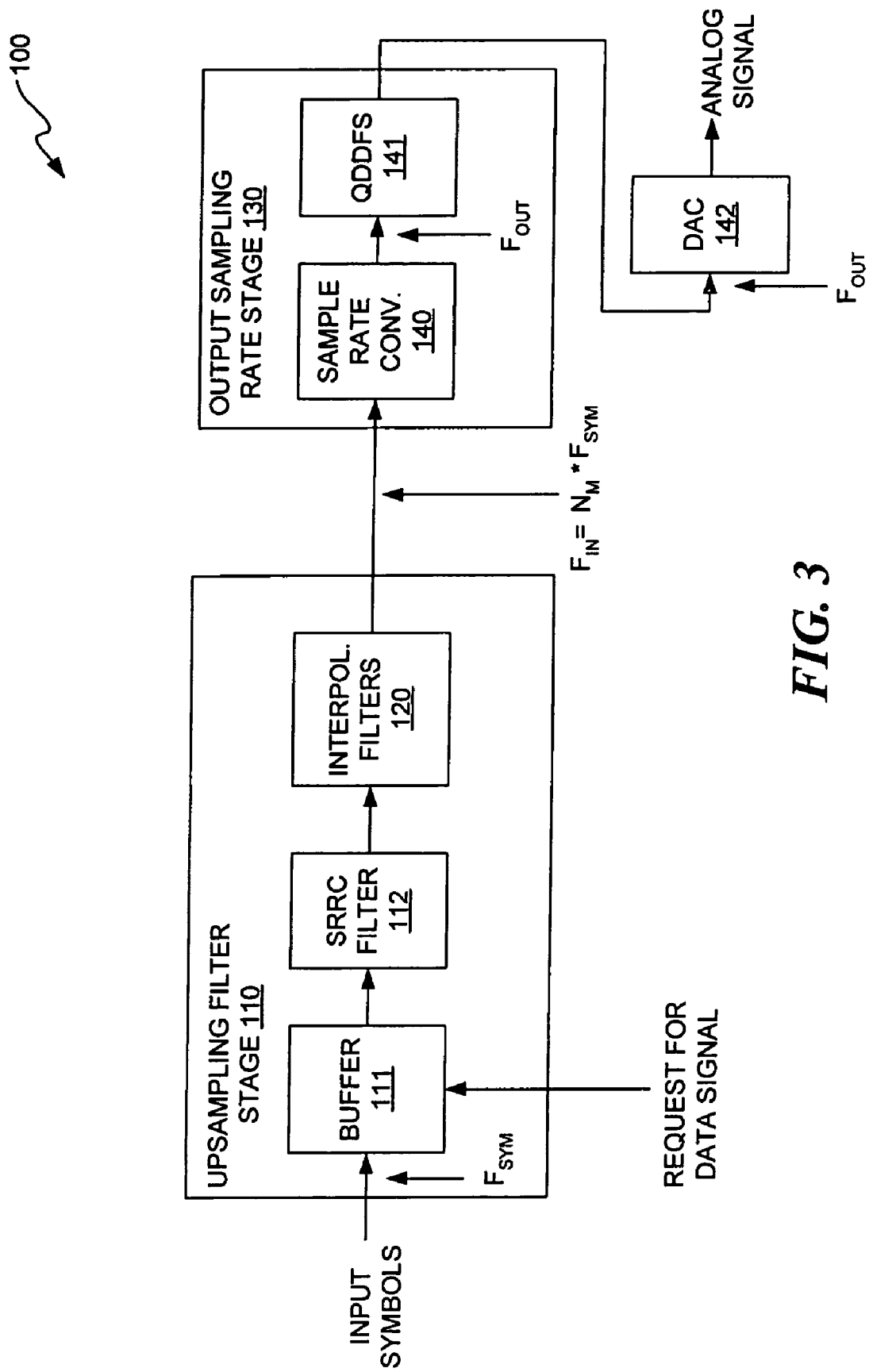
FIG. 3 illustrates a block diagram of the digital modulator of the invention in accordance with an exemplary embodiment.

FIG. 3 illustrates a block diagram of the digital modulator 100 of the invention in accordance with an exemplary embodiment. The digital modulator 100 has an upsampling filter stage 110 and an output sampling rate stage 130. The upsampling filter stage 110 has a buffer 111 that receives the input symbols to be upsampled, an SRRC filter 112 that performs pulse shaping, and one or more interpolation filters 120 that perform upsampling. As stated above, unlike the interpolation filter stages 5 and 6 described above with reference to FIG. 1, the interpolation filter 120 does not require the use of any reference clocks derived from the NCO (FIG. 4), and thus may be implemented in software, hardware, or in a combination of software and hardware.

The output sampling rate stage 130 shown in FIG. 3 includes a sample rate converter 140, which is described below in detail with reference to FIG. 4. The output sampling rate stage 130 includes a QDDFs 141 and DAC 142, which may be identical to the QDDFS 8 and the DAC 9, respectively, shown in FIG. 1. As described below in detail, unlike the sample rate converter 7 described above with reference to FIG. 1, it is not necessary that the output sample rate, $F_{OUT}$, of the sample rate converter 140 be at least twice as great as the input sample rate, $F_{IN}$, of the sample rate converter 140.

Figure 4:
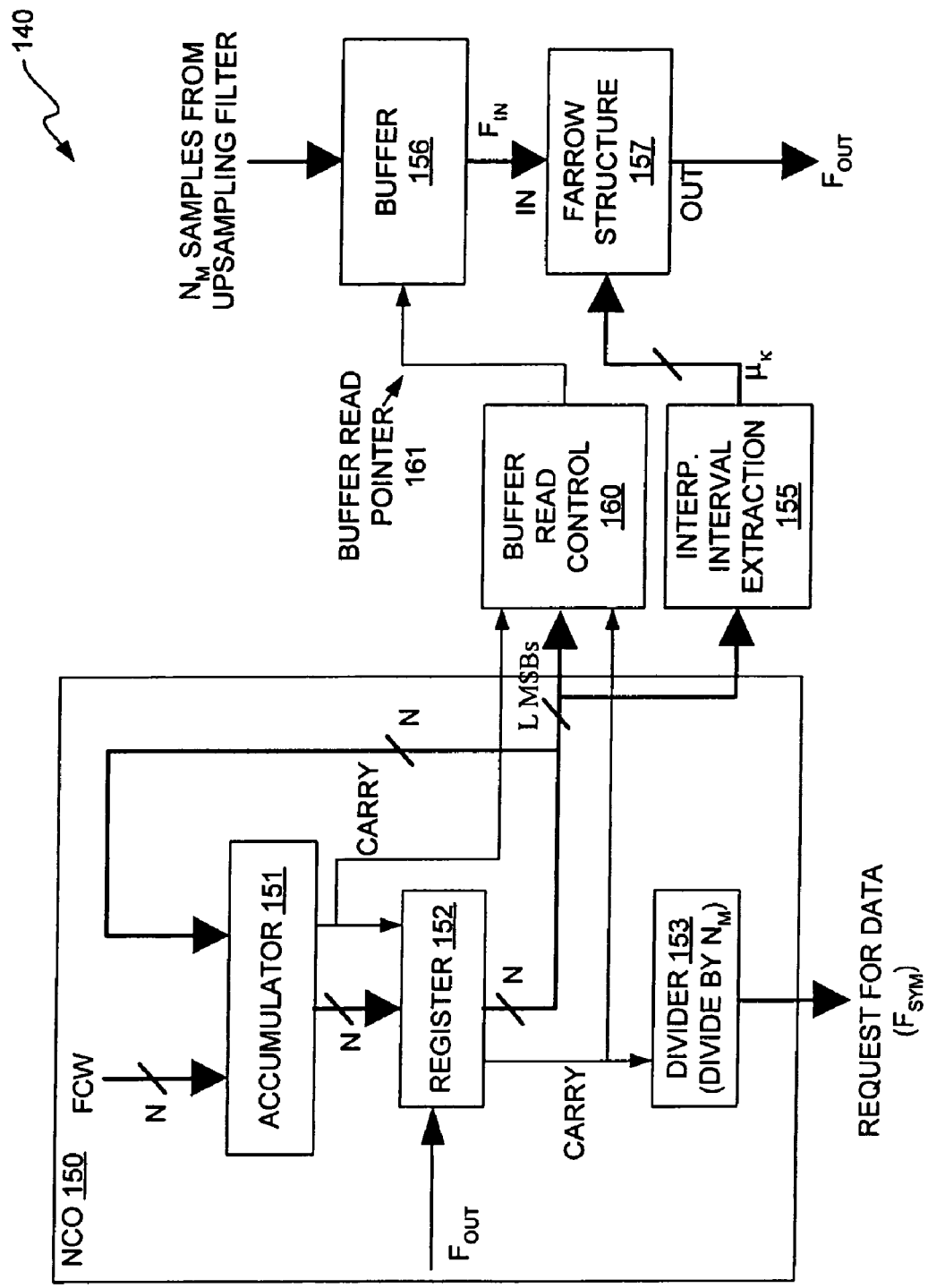
FIG. 4 illustrates a block diagram of the sample rate converter of the digital modulator shown in FIG. 3.

FIG. 4 illustrates a block diagram of the sample rate converter 140 shown in FIG. 3. The NCO 150 of the sample rate converter 140 has an accumulator 151 that adds the value of the N-bit FCW to the N-bit accumulated results from the previous clock cycle stored in register 152. The carry output from the accumulator 151 is stored in the register 152 along with the N-bit accumulated results. As is well known in the art of sample rate converters, the carry output from the accumulator 151 asserts at an effective rate of $F_{IN}$ when the FCW is configured to be $F_{IN}/F_{OUT}$. The value stored in the register 152 is clocked out at the output sampling rate of $F_{OUT}$.

A divider 153 divides the carry output by the interpolation ratio, $N_M$, to generate a "REQUEST FOR DATA" signal, which asserts at the rate of $F_{SYM}$. With reference again to FIG. 3, the REQUEST FOR DATA signal controls the timing of inputting symbols to the buffer 111 and outputting the symbols from the buffer 111. The REQUEST FOR DATA signal is used to synchronize the timing of inputting the input symbols to the upsampling filter stage 110 to the timing of the output signal from the upsampling filter stage 110 sampled at rate $F_{IN}$, which is input to the output sampling rate stage 130. Thus, using the REQUEST FOR DATA signal obviates the need to use reference clocks for the interpolation stage that are generated by the NCO, as is the case with the configuration shown in FIG. 1.

A buffer read control logic component 160 receives the current carry output, the carry output from the previous clock cycle and the N-bit accumulated value stored in register 152. The read buffer control logic 160 processes these bits in the manner described below with reference to FIGS. 5–7 to generate a buffer read pointer that addresses the buffer 156 to cause samples to be read out of the buffer 156 and provided to the Farrow Structure 157.

An interpolation interval extraction logic component 155 receives the N-bit value stored in register 152 and extracts the interpolation interval $\mu_k$ from the N-bit value. The interpolation interval $\mu_k$ is provided to the Farrow Structure 157, which performs polynomial-based interpolation. For the case in which an even number of basepoints is used by the Farrow Structure 157 to perform polynomial-based interpolation, the interpolation interval $\mu_k$ is simply a number L of the MSBs of the N-bit value stored in the accumulator 151. For the case in which an odd number of basepoints is used by the Farrow Structure 157 to perform polynomial-based interpolation, the interpolation interval $\mu_k$ is derived by: 1) extracting a number L of the MSBs of the N-bit value stored in the accumulator 151; and 2) pre-pending the MSB of the same accumulator value to the L-bit value produced by step 1. Then, the value of the interpolation interval $\mu_k$ is represented using the two's complement system. The Farrow Structure 157 uses $\mu_k$ to determine the coefficients that are to be multiplied by the value read out of the buffer 156. The manner in which the Farrow Structure 157 performs polynomial-based interpolation is well known, and therefore will not be described herein in the interest of brevity.

Figure 5:
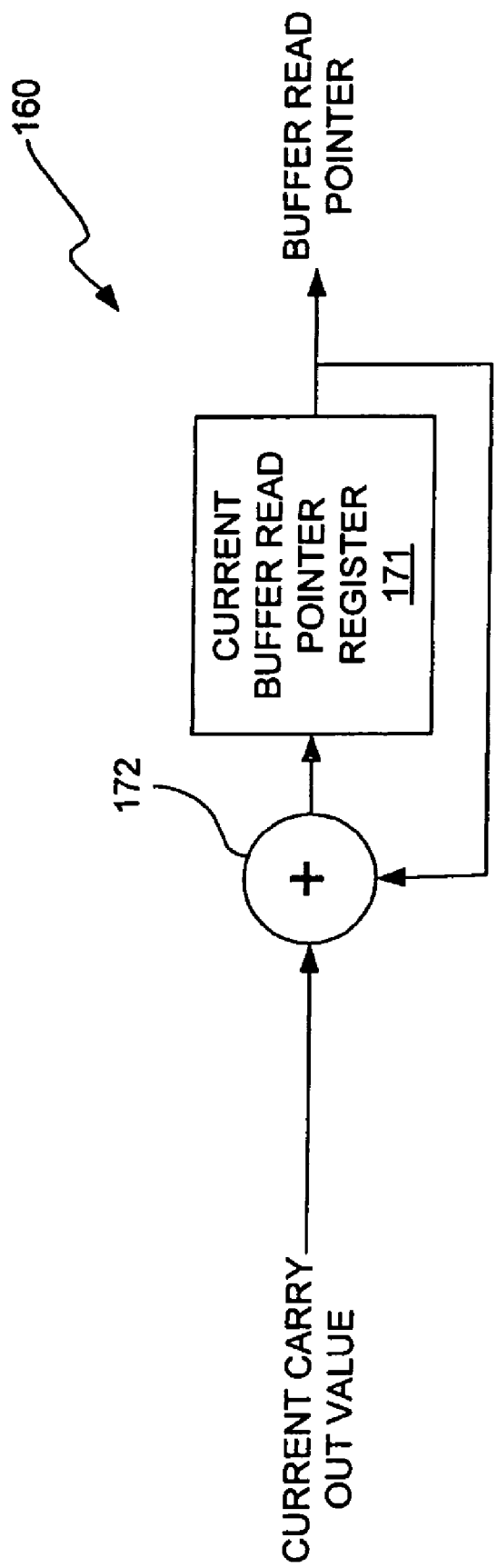
FIG. 5 illustrates a block diagram of buffer read control logic of the sample rate converter shown in FIG. 4.

When an even number of basepoints is used, the calculation of the buffer read pointer 161 is very straight forward because no rounding off takes place. FIG. 5 illustrates a block diagram of the buffer read control logic 160 configured to calculate the buffer read pointer when an even number of basepoints is used. Whenever the carry out signal asserts, a read operation from the buffer 156 shown in FIG. 4 should occur. The nature of the NCO 150 ensures that the carry out signal asserts at a rate of $F_{IN}$. Therefore, the buffer read pointer increments at this rate, thereby causing samples stored at the corresponding addresses in the buffer 156 to be read out and delivered to the Farrow Structure 157 at this rate. Each time the carry out signal equals one, that value is added to the current buffer read pointer stored in register 171 by summer 172 to obtain the next buffer read pointer 161, which then addresses the buffer 156. Whenever the carry out signal equals zero, that value is added by the summer 172 to the current buffer read pointer stored in register 171 such that the next buffer read pointer is the same as the current buffer read pointer, i.e., the buffer read pointer does not change, and therefore a new sample is not read from the buffer 156.

For the case in which an odd number of basepoints are used, the buffer read control logic component 160 will include additional logic for performing non-linear operations such as rounding off, for example, as described below in detail with reference to FIGS. 6 and 7. The FCW used by the NCO 150 is always less than one when interpolation is being performed. If the FCW is greater than one, decimation rather than interpolation is being performed. Therefore, only the case in which FCW is less than one is considered herein, i.e., $F_{IN} < F_{OUT}$.

FIG. 6 illustrates a table that is implemented in the buffer read control logic 160 when an odd number of basepoints are used. Before describing the table shown in FIG. 6, the terms used in the table will be defined. The term "NCO[k]" corresponds to the current sample, i.e., the current value in the accumulator 151. The term "NCO[k–1]" corresponds to the previous accumulated value, i.e., the value in register 152. The term "CO[k]" corresponds to the carry out value of the current accumulation result produced by the accumulator 151. The term $n_k$ corresponds to the basepoint index. The term "INCREASE_$n_k$" corresponds to the flag that indicates that the basepoint index $n_k$ needs to be incremented.

When the value of INCREASE_$n_k$ is 1, the buffer read pointer is incremented and a new sample is read from the buffer 156. When the value of INCREASE_$n_k$ is 0, the buffer read pointer is not incremented, and therefore a new sample is not read from the buffer 156. Whether the basepoint index $n_k$ should be incremented is dependent on: 1) whether the previous accumulated value NCO[k–1], which is stored in register 152, is greater than or equal to 0.5; 2) whether the current accumulated value NCO[k], which is contained in the accumulator 151, is greater than or equal to 0.5; and whether the current carry out value output from the accumulator 151 is equal to 1.

It can be seen from Table 1 that when NCO[k–1] is greater than or equal to 0.5, and the current carry out value is 1, and NCO[k] is less than 0.5, there is no increase in the basepoint index $n_k$, and therefore no new sample is read out of the buffer 156. When NCO[k–1] is greater than or equal to 0.5, and the current carry out value is 1, and NCO[k] is greater than or equal to 0.5, there is an increase in the basepoint index $n_k$, which results in a new sample being read out of the buffer 156. When NCO[k–1] is greater than or equal to 0.5, and the current carry out value is 0, and NCO[k] is greater than or equal to 0.5, there is no increase in the basepoint index $n_k$, and therefore no new sample is read out of the buffer 156. When NCO[k–1] is less than 0.5, and the current carry out value is 1, and NCO[k] is less than 0.5, there is an increase in the basepoint index $n_k$, and therefore a new sample is read out of the buffer 156. When NCO[k–1] is less than 0.5, and the current carry out value is 0, and NCO[k] is greater than or equal to 0.5, there is an increase in the basepoint index $n_k$, and therefore a new sample is read out of the buffer 156. When NCO[k–1] is less than 0.5, and the current carry out value is 0, and NCO[k] is less than 0.5, there is no increase in the basepoint index $n_k$, and therefore no new sample is read out of the buffer 156.

Figure 7:
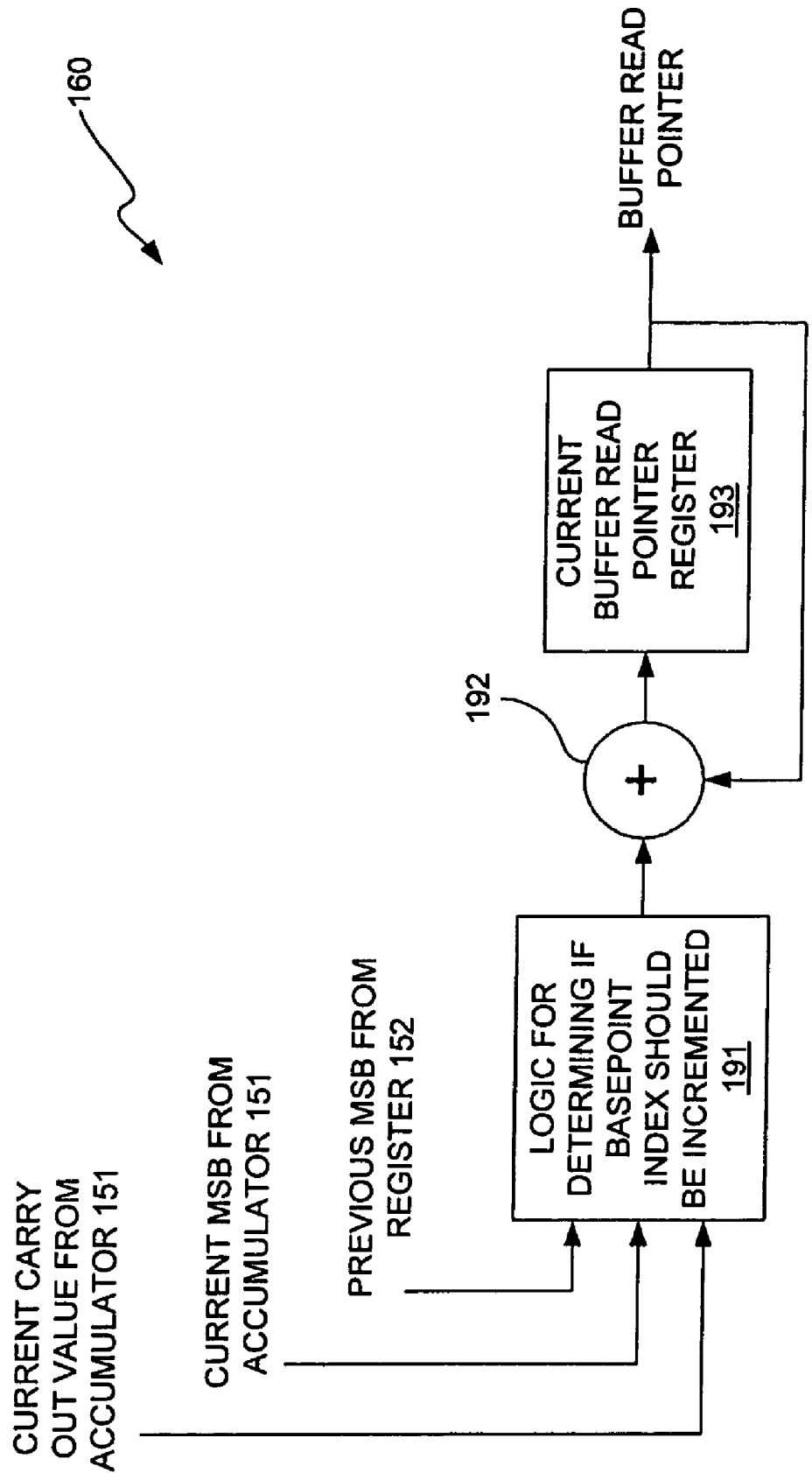
FIG. 7 illustrates a block diagram of the buffer read control logic shown in FIG. 5 configured to make the determinations described be the table shown in FIG. 6.

FIG. 7 illustrates a block diagram of the buffer read control logic 160 configured to make the determinations described above with reference to Table 1. Because a variety of logic gate configurations can be used to perform these operations, the logic for performing these functions is represented in FIG. 7 simply by a block 191. Those skilled in the art will understand, in view of the description provided herein, the manner in which a suitable logic gate configuration may be designed and implemented to perform the operations described above with reference to Table 1.

With reference to FIG. 7, the logic for performing the operations described above with reference to Table 1 receives the current carry out value from the accumulator 151, the current MSB from the value in the accumulator 151 and the current MSB from the value stored in register 152.

If the MSB in the accumulator 151 is a 1, this indicates that the value in the accumulator is greater than or equal to 0.5. Likewise, if the MSB in the register 152 is 1, this indicates that the value in register 152 is greater than or equal to 0.5. The output of logic component 191 is either a 0 or a 1. If the output of logic component 191 is a 0, the summer 192 adds this value to the current read pointer value stored in register 193. The result is that the read pointer remains the same, and therefore no new sample is read out of buffer 156. If the output of logic component 191 is a 1, the summer 192 adds this value to the current read pointer value stored in register 193. The result is that the read pointer is incremented, and therefore a new sample is read out of buffer 156.

Figure 8:
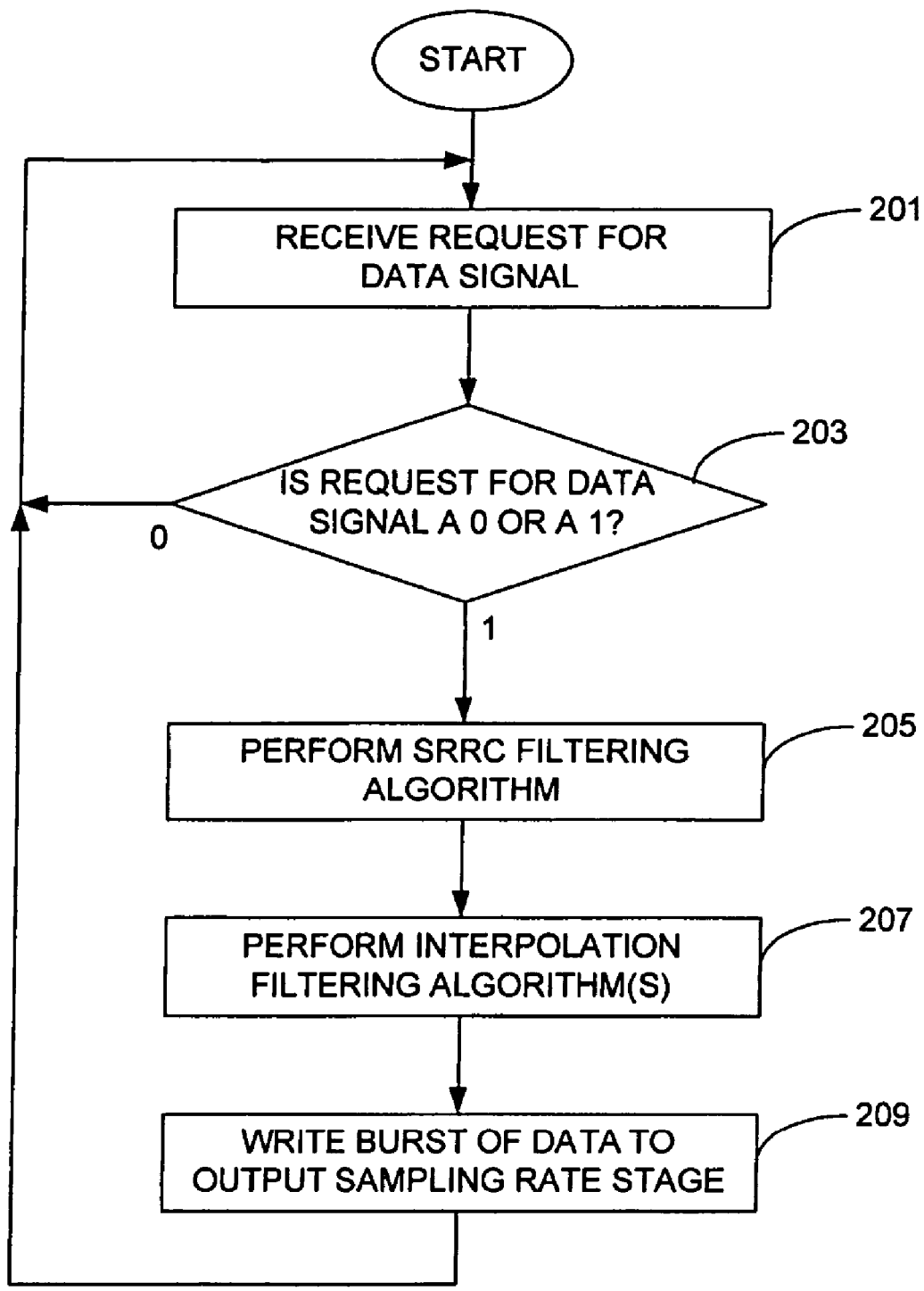
FIG. 8 illustrates a flowchart of the interpolation method of the invention in accordance with an exemplary embodiment.

FIG. 8 illustrates a flowchart that demonstrates the method of the invention in accordance with an exemplary embodiment is performed in software by the upsampling filter stage 110 shown in FIG. 3. In accordance with this embodiment, the SRRC and interpolation algorithms represented in FIG. 3 by blocks 112 and 120 are implemented together in one software program. However, as stated above, these algorithms may be implemented in software, hardware, or in a combination of software and hardware.

With reference to FIG. 8, a Request For Data signal is received by the upsampling filter stage, as indicated by block 201. A determination is made as to whether the Request For Data Signal is a 0 or a 1, as indicated by block 203. If it is a 0, the process returns to block 201. If it is a 1, the process proceeds to block 205, and the SRRC filtering algorithm 3 is performed. Of course, the Request For Data signal can be inverted such that when it is a 1, the process returns to block 201, and such that when it is a 0, the process proceeds to block 205. In other words, the Request For Data signal can be asserted when it is 1 and deasserted when it is 0, or asserted when it is 0 and deasserted when it is 1.

At block 205, the SRRC filtering is performed. The SRRC-filtered signal is then interpolated by one or more interpolation algorithms, as indicated by block 207. The interpolated data is then written in a burst to the output sampling rate stage, as indicated by block 209. The process then returns to block 201 and is repeated. The output sampling rate stage processes the bursts of data in the manner described above with reference to FIGS. 3–7.

In the case where one or more components of the invention are implemented in software, such as the interpolation filter stage 120 and/or the SRRC filter 112, the invention encompasses a computer-readable medium have instructions stored on it that may be executed by a computer to perform the interpolation and/or SRRC filter algorithms. The computer-readable medium may be well known memory devices such as, for example, random access memory (RAM), dynamic RAM (DRAM), flash memory, read only memory (ROM) compact disk ROM (CD-ROM), digital video disks (DVDs), magnetic disks, magnetic tapes, etc. The invention also encompasses electrical signals modulated on wired and wireless carriers (e.g., electrical conductors, wireless carrier waves, etc.) in packets and in non-packet formats.

It should be noted that the invention has been described with reference to particular embodiments, and that the invention is not limited to the embodiments described herein. Those skilled in the art will understand that many modifications may be made to the embodiments described herein and that all such modifications are within the scope of the invention.

What is claimed is:

1. An apparatus for performing sample rate conversion comprising:

an upsampling filter stage having an interpolation filter stage for performing upsampling interpolation on an input signal to the upsampling filter stage, the interpolation filter stage interpolating the input signal with a cumulative interpolation ratio product of $N_M$ to produce an upsampled signal, the input signal to the upsampling filter stage having a sample rate of $F_{SYM}$, the upsampled signal produced by the interpolation filter stage having a sample rate of $F_{IN}$, wherein $F_{IN}=N_M \times F_{SYM}$; and an output sampling rate stage having a sample rate converter, the output sampling rate stage receiving the upsampled signal having the sample rate of $F_{IN}$, the sample rate converter converting the upsampled signal into an output signal having a sample rate of $F_{OUT}$, wherein a ratio of $F_{OUT}$ to $F_{IN}$ is less than two, wherein the sample rate converter comprises: a numerically controlled oscillator (NCO) having an accumulator, a register and a divider, the accumulator receiving a frequency control word (FCW) and adding the FCW with a previous accumulated value to produce a current accumulated value, the current accumulated value including a current carry out value, the register temporarily storing the previous accumulated value, the previous accumulated value including a previous carry out value, and wherein the divider receives the previous carry out value from the register, the divider dividing the previous carry out value by $N_M$ to produce a control signal having a frequency equal to $F_{SYM}$, the control signal being output to the upsampling filter stage, the upsampling filter stage using the control signal to control timing of inputting the input signal to the upsampling filter stage.

2. The apparatus of claim 1, wherein the interpolation filter stage is implemented in software being executed by a computational device.

3. The apparatus of claim 1, wherein the interpolation filter stage is implemented in hardware.

4. The apparatus of claim 1, wherein the sample rate converter further comprises:

a buffer configured to receive and store samples of the upsampled signal produced by the interpolation filter stage;

a buffer read controller that controls when samples stored in the buffer are read from the buffer;

a Farrow Structure that receives samples read from the buffer and performs polynomial-based interpolation on the samples received from the buffer to produce said output signal having the sample rate of $F_{OUT}$; and an interpolation interval extractor that extracts an interpolation interval, $\mu_k$, that is delivered to the Farrow Structure and used by the Farrow Structure to perform polynomial-based interpolation.

5. The apparatus of claim 4, wherein the buffer read controller is configured to use an even number of basepoints to control when samples stored in the buffer are read from the buffer.

6. The apparatus of claim 5, wherein the buffer read controller receives the current carry out value and adds the current carry out value to a previous buffer read pointer value to obtain a current buffer read pointer value, the current buffer read pointer value being used to address the buffer.

7. The apparatus of claim 4, wherein the buffer read controller is configured to use an odd number of basepoints to control when samples stored in the buffer are read from the buffer.

8. The apparatus of claim 7, wherein the buffer read controller receives the current carry out value, at least a most significant bit (MSB) of the current accumulated value, and at least a MSB of the previous accumulated value, and uses the received values to determine whether a buffer read pointer value is to be incremented.

9. An apparatus for performing sample rate conversion comprising:
   an upsampling filter stage having an interpolation filter stage for performing upsampling interpolation on an input signal to the upsampling filter stage, the interpolation filter stage interpolating the input signal with a cumulative interpolation ratio product of $N_M$ to produce an upsampled signal, the interpolation filter stage being implemented in software executed by a computational device, the input signal to the upsampling filter stage having a sample rate of $F_{SYM}$, the upsampled signal produced by the interpolation filter stage having a sample rate of $F_{IN}$, wherein $F_{IN}=N_M \times F_{SYM}$; and
   an output sampling rate stage having a sample rate converter, the output sampling rate stage receiving the upsampled signal having the sample rate of $F_{IN}$, the sample rate converter converting the upsampled signal into an output signal having a sample rate of $F_{OUT}$,
   wherein the sample rate converter comprises: a numerically controlled oscillator (NCO) having an accumulator, a register and a divider, the accumulator receiving a frequency control word (FCW) and adding the FCW with a previous accumulated value to produce a current accumulated value, the current accumulated value including a current carry out value, the register temporarily storing the previous accumulated value, the previous accumulated value including a previous carry out value, and wherein the divider receives the previous carry out value from the register, the divider dividing the previous carry out value by $N_M$ to produce a control signal having a frequency equal to $F_{SYM}$, the control signal being output to the upsampling filter stage, the upsampling filter stage using the control signal to control timing of inputting the input signal to the upsampling filter stage.

10. The apparatus of claim 9, wherein the sample rate converter farther comprises:
    a buffer configured to receive and store samples of the upsampled signal produced by the interpolation filter stage;
    a buffer read controller that controls when samples stored in the buffer are read from the buffer;
    a Farrow Structure that receives samples read from the buffer and performs polynomial-based interpolation on the samples received from the buffer to produce said output signal having the sample rate of $F_{OUT}$; and
    an interpolation interval extractor that extracts an interpolation interval, $\mu_k$, that is delivered to the Farrow Structure and used by the Farrow Structure to perform polynomial-based interpolation.

11. The apparatus of claim 10, wherein the buffer read controller is configured to use an even number of basepoints to control when samples stored in the buffer are read from the buffer.

12. The apparatus of claim 11, wherein the buffer read controller receives the current carry out value and adds the current carry out value to a previous buffer read pointer value to obtain a current buffer read pointer value, the current buffer read pointer value being used to address the buffer.

13. The apparatus of claim 10, wherein the buffer read controller is configured to use an odd number of basepoints to control when samples stored in the buffer are read from the buffer.

14. The apparatus of claim 13, wherein the buffer read controller receives the current carry out value, at least a most significant bit (MSB) of the current accumulated value, and at least a MSB of the previous accumulated value, and uses the received values to determine whether a buffer read pointer value is to be incremented.

15. An apparatus for performing sample rate conversion comprising:
    an upsampling filter stage having an interpolation filter stage for performing upsampling interpolation on an input signal to the upsampling filter stage, the interpolation filter stage interpolating the input signal with a cumulative interpolation ratio product of $N_M$ to produce an upsampled signal, the input signal to the upsampling filter stage having a sample rate of $F_{SYM}$, the upsampled signal produced by the interpolation filter stage having a sample rate of $F_{IN}$, wherein $F_{IN}=N_M \times F_{SYM}$; and
    an output sampling rate stage having a sample rate converter, wherein the sample rate converter comprises a numerically controlled oscillator (NCO) having an accumulator, a register and a divider, the accumulator receiving a frequency control word (FCW) and adding the FCW with a previous accumulated value to produce a current accumulated value, the current accumulated value including a current carry out value, the register temporarily storing the previous accumulated value, the previous accumulated value including a previous carry out value, and wherein the divider receives the previous carry out value from the register, the divider dividing the previous carry out value by $N_M$ to produce a control signal having a frequency equal to $F_{SYM}$, the control signal being output to the upsampling filter stage, the upsampling filter stage using the control signal to control timing of inputting the input signal to the upsampling filter stage.

16. The apparatus of claim 15, wherein the interpolation filter stage is implemented in software being executed by a computational device.

17. The apparatus of claim 15, wherein the interpolation filter stage is implemented in hardware.

18. The apparatus of claim 17, wherein the sample rate converter further comprises:
    a buffer configured to receive and store samples of the upsampled signal produced by the interpolation filter stage;
    a buffer read controller that controls when samples stored in the buffer are read from the buffer;
    a Farrow Structure that receives samples read from the buffer and performs polynomial-based interpolation on the samples received from the buffer to produce said output signal having the sample rate of $F_{OUT}$; and
    an interpolation interval extractor that extracts an interpolation interval, $\mu_k$, that is delivered to the Farrow Structure and used by the Farrow Structure to perform polynomial-based interpolation.

19. The apparatus of claim 18, wherein the buffer read controller is configured to use an odd number of basepoints to control when samples stored in the buffer are read from the buffer.

20. The apparatus of claim 18, wherein the buffer read controller receives the current carry out value and adds the current carry out value to a previous buffer read pointer value to obtain a current buffer read pointer value, the current buffer read pointer value being used to address the buffer.

21. The apparatus of claim 19, wherein the buffer read controller receives the current carry out value, at least a most significant bit (MSB) of the current accumulated value, and at least a MSB of the previous accumulated value, and uses the received values to determine whether a buffer read pointer value is to be incremented.

22. A method for performing sample rate conversion comprising:

receiving a Request For Data signal in an upsampling filter stage;

receiving an input signal in the upsampling filter stage;

when the Request For Data signal is asserted, interpolating the input signal with a cumulative interpolation ratio product of $N_M$ to produce an upsampled signal, the input signal to the upsampling filter stage having a sample rate of $F_{SYM}$, the upsampled signal produced by the interpolation filter stage having a sample rate of $F_{IN}$, wherein $F_{IN}=N_M \times F_{SYM}$; and writing the upsampled signal to an output sampling rate stage having a sample rate converter, wherein the sample rate converter comprises: a numerically controlled oscillator (NCO) having an accumulator, a register and a divider, the accumulator receiving a frequency control word (FCW) and adding the FCW with a previous accumulated value to produce a current accumulated value, the current accumulated value including a current carry out value, the register temporarily storing the previous accumulated value, the previous accumulated value including a previous carry out value, and wherein the divider receives the previous carry out value from the register, the divider dividing the previous carry out value by $N_M$ to produce a control signal having a frequency equal to $F_{SYM}$, the control signal being output to the upsampling filter stage, the upsampling filter stage using the control signal to control timing of inputting the input signal to the upsampling filter stage.

23. The method of claim 22, further comprising:

in the sample rate converter, converting the upsampled signal into an output signal having a sample rate of $F_{OUT}$, wherein a ratio of $F_{OUT}$ to $F_{IN}$ is less than two.

24. The method of claim 22, wherein the method is implemented in software being executed by a computational device.

25. The method of claim 22, wherein the method is implemented in hardware.

26. A computer program embodied in a computer-readable medium, the program comprising instructions for execution by a computer, the program comprising:

instructions for receiving a Request For Data signal in an upsampling filter stage;

instructions for receiving an input signal in the upsampling filter stage;

instructions for causing the input signal to be interpolated when the received Request For Data signal is asserted, the input signal being interpolated with a cumulative interpolation ratio product of $N_M$ to produce an upsampled signal, the input signal to the upsampling filter stage having a sample rate of $F_{SYM}$, the upsampled signal produced by the interpolation filter stage having a sample rate of $F_{IN}$, wherein $F_{IN}=N_M \times F_{SYM}$; and instructions for writing the upsampled signal to an output sampling rate stage having a sample rate converter, wherein the sample rate converter comprises: a numerically controlled oscillator (NCO) having an accumulator, a register and a divider, the accumulator receiving a frequency control word (FCW) and adding the FCW with a previous accumulated value to produce a current accumulated value, the current accumulated value including a current carry out value, the register temporarily storing the previous accumulated value, the previous accumulated value including a previous carry out value, and wherein the divider receives the previous carry out value from the register, the divider dividing the previous carry out value by $N_M$ to produce a control signal having a frequency equal to $F_{SYM}$, the control signal being output to the upsampling filter stage, the upsampling filter stage using the control signal to control timing of inputting the input signal to the upsampling filter stage.

* * * * *